United States Patent [19]

Juliana, Jr. et al.

[11] Patent Number: 4,645,338
[45] Date of Patent: Feb. 24, 1987

[54] OPTICAL SYSTEM FOR FOCUS CORRECTION FOR A LITHOGRAPHIC TOOL

[75] Inventors: Anthony Juliana, Jr.; Milton R. Latta; Glenn V. Sincerbox; Carlton G. Willson, all of San Jose, Calif.

[73] Assignee: International Business Machines Corporation, Armonk, N.Y.

[21] Appl. No.: 727,644

[22] Filed: Apr. 26, 1985

[51] Int. Cl.$^4$ .............................................. G01B 11/27
[52] U.S. Cl. ...................................... 356/150; 356/152
[58] Field of Search ............... 356/354, 356, 345, 355, 356/357, 358, 361, 362, 363, 400, 401, 150–152

[56] References Cited

U.S. PATENT DOCUMENTS

| | | | |
|---|---|---|---|
| 3,274,913 | 9/1966 | Biedermann et al. | 95/44 |
| 3,945,023 | 3/1976 | Stauffer | 354/409 X |
| 4,153,367 | 5/1979 | Lietar et al. | 356/400 |
| 4,183,642 | 1/1980 | Fukuoka | 354/406 X |
| 4,201,456 | 5/1980 | Walbarsht | 354/406 X |
| 4,211,489 | 7/1980 | Kleinknecht et al. | 356/400 |
| 4,311,904 | 1/1982 | Okada et al. | 354/406 X |
| 4,453,818 | 6/1984 | Hayashi et al. | 354/406 |
| 4,583,852 | 4/1986 | Cassidy et al. | 356/152 |
| 4,585,337 | 4/1986 | Phillips | 356/152 X |

*Primary Examiner*—Eugene R. Laroche
*Assistant Examiner*—David Mis
*Attorney, Agent, or Firm*—Joseph G. Walsh

[57] ABSTRACT

An apparatus and process for determining focus correction for a lithographic tool are provided. A periodic surface relief structure containing focus information is illuminated so that diffraction beams are generated. An object is translated orthogonally to the periodic structure to cause a change in the intensity of the diffracted beams. Focus correction is determined based upon the changes in the intensity of the diffracted beams.

6 Claims, 7 Drawing Figures

OPTICAL SCHEMATIC OF DIFFRACTION FOCUSING TOOL

BANDING AND STRIPING PATTERN

OPTICAL SCHEMATIC OF DIFFRACTION FOCUSING TOOL

TEST SURFACE IN FOCUS

COMPOUND TILTS ABOUT THE x AND y AXES

DIFFRACTION BASED MEASURMENT OF BANDING PATTERN

OPTICAL SYSTEM FOR FOCUS CORRECTION FOR A LITHOGRAPHIC TOOL

DESCRIPTION

1. Technical Field

The present invention is concerned with a process and an apparatus for determining focus correction for a lithographic tool.

2. Background Art

Automatic focussing is well known in the field of photography as is shown, for example, in U.S. Pat. Nos. 3,274,913, 3,945,023, 4,183,642, 4,201,456, 4,311,904 and 4,453,818. In the field of lithographic tools, however, all focus correction techniques currently employed require visual inspection. The present invention provides an apparatus and technique which improves upon the accuracy and speed of previous methods by eliminating the visual inspection and replacing it with a machine-read inspection. This inspection is based upon a measurement of the light intensity diffracted from a fine line pattern which acts as a diffraction grating.

DISCLOSURE OF THE INVENTION

According to the present invention, a periodic surface relief structure containing focus information on a test object created in a lithographic tool is illuminated so that diffraction beams are generated. The object is translated orthogonally to the periodic structure to cause a change in the intensity of the diffracted beam. The intensity of said diffracted beam is then measured and, based upon the changes in the diffracted intensity, focus correction is determined.

The apparatus of the present invention provides machine-read focus data in less than one minute and has an accuracy of plus or minus 0.3 microns for focus shift determination and plus or minus 0.03 microns/cm for focus tilt determination.

An understanding of the invention will be facilitated by reference to the accompanying drawings.

DESCRIPTION OF THE DRAWINGS

FIG. 2 is an illustration of focus shift determination using a bias tilt between the test object surface and ideal image planes.

The present invention provides an apparatus and process for precisely, repeatably and rapidly determining the optimum focus position for a lithographic tool. It is particularly suitable for use for photolithographic tools, such as, the Perkin-Elmer Company's Model 500. In such a tool a 1:1 reflective imaging system images the mask onto a surface coated with a photosensitive material—typically a semiconductor wafer coated with photoresist. An annular region of best image quality is illuminated through a condenser system and sequentially exposed onto the surface through a synchronous scan of the mask and surface. Because of the small features (1 to 2 microns) being images with these tools, the depth of focus is also small (several microns) and accurate focus determination is essential. All current methods require a visual inspection step.

In the present invention, the visual inspection is replaced with a machine-read inspection which is based upon a measurement of the light intensity diffracted from a fine line pattern which acts as a diffraction grating.

Figure 1:
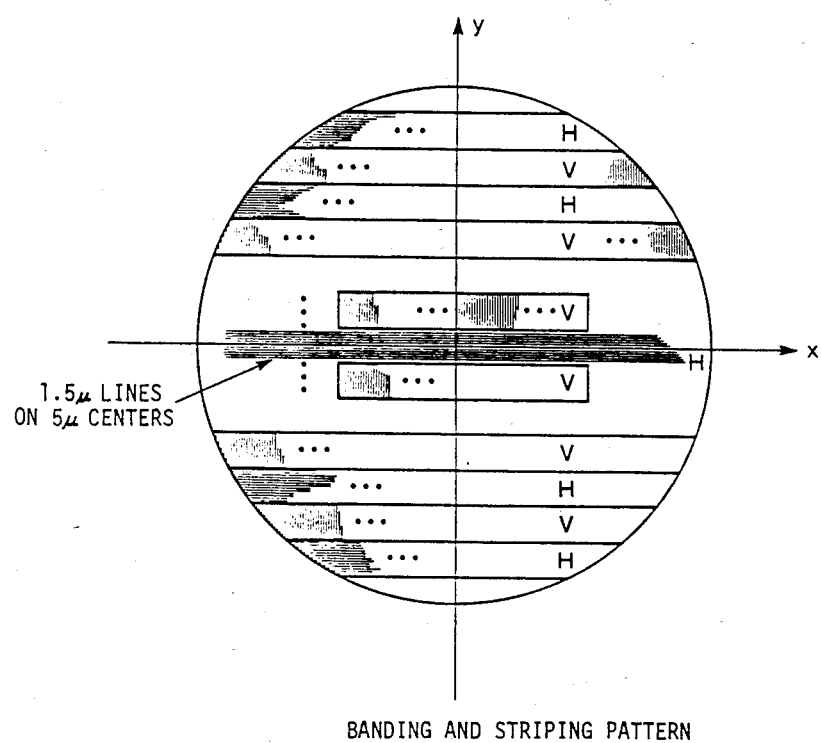
FIG. 1 shows a banding and striping pattern employed in the present invention.
Figure 2A:
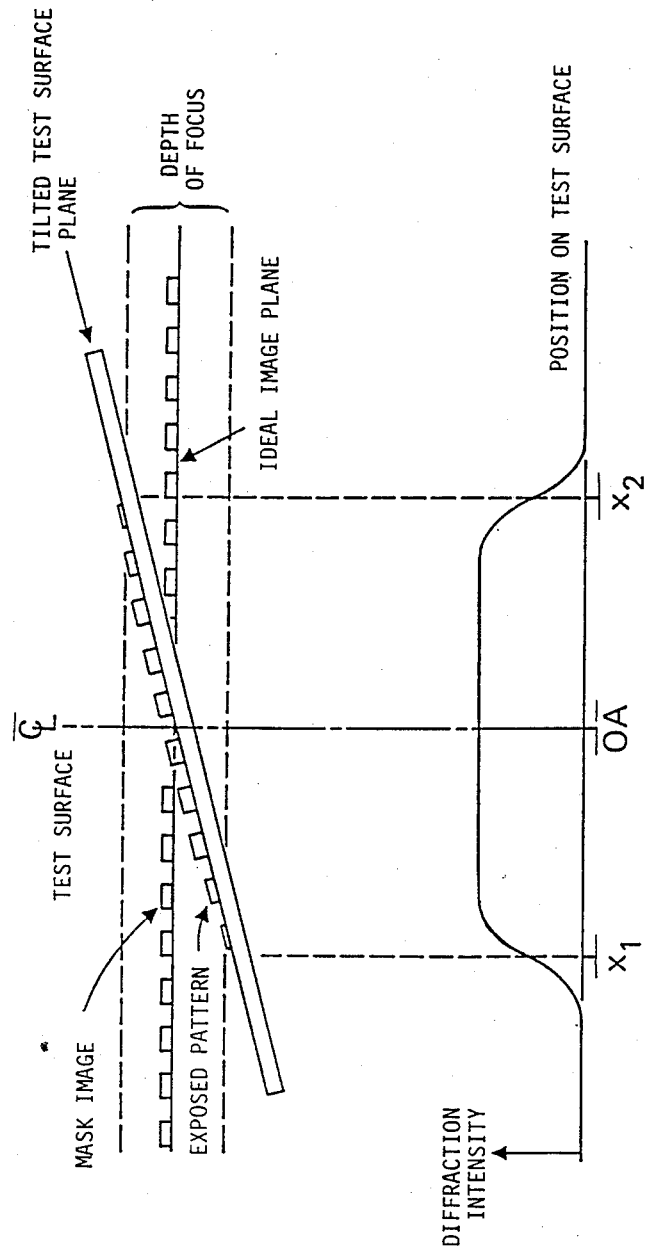
FIG. 2A shows the test object surface in focus.
Figure 2B:
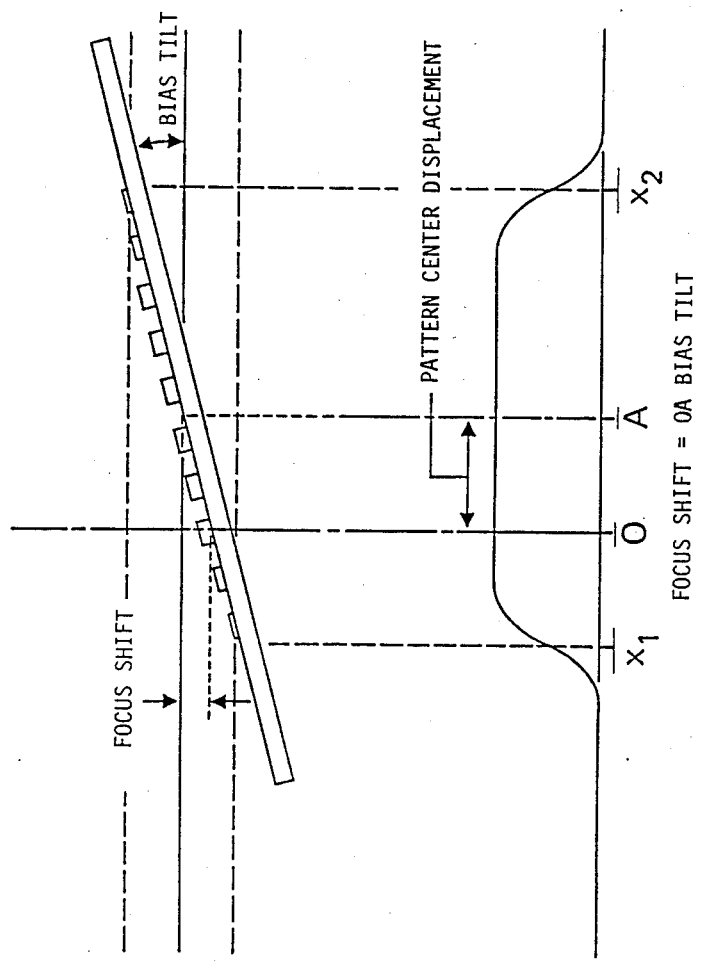
FIG. 2B shows the test object surface out of focus.

A suitable mask pattern is shown in FIG. 1. It consists of alternating bands of finely spaced horizontal and vertical lines. These lines are 1.5 microns wide and are located on 5 micron centers. In order to test the focussing in the lithographic tool a bias tilt is introduced. By tilting about the y axis, the vertical lines will be in focus over a limited extent in the x direction. This is illustrated sequentially in FIG. 2 where the lateral extent of the pattern is dependent on the tool depth of focus and the angle of tilt between the wafer and ideal image planes.

Figure 3:
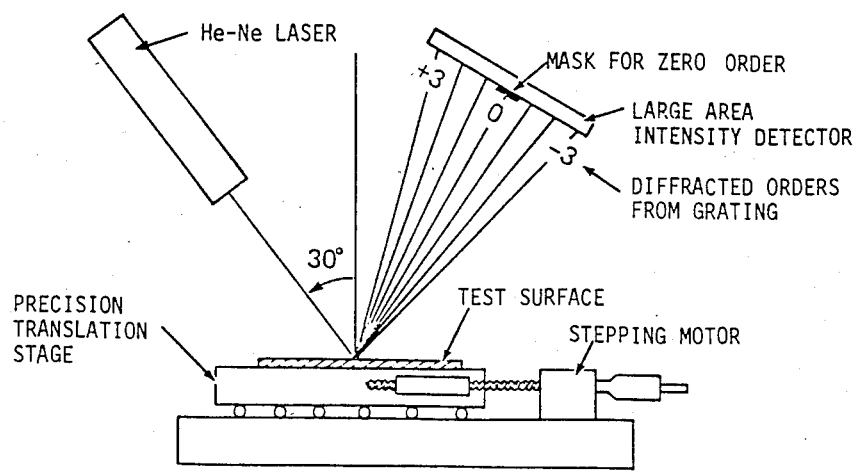
FIG. 3 shows an optical schematic of one apparatus embodying the present invention.

After exposure in the photolithographic tool and subsequent development, the test surface is illuminated, preferably using a laser, such as a helium-neon laser as shown in FIG. 3. The grating pattern on the surface diffracts light as shown in FIG. 3. No light is diffracted from the out-of-focus pattern. By translating the surface perpendicular to the grating lines, the extent of the exposed pattern can be determined by measuring the variations in diffraction efficiency. The extent of the in-focus pattern is determined by locating the transitions from out-of-focus to in-focus on each side of the pattern. The position of best focus is located at the center of the diffraction efficiency scan. By accurately determining this position with respect to the center of the surface, distance OC in FIG. 5, and knowing the bias tilt, $\alpha$, for exposure, the amount of focus correction required, $\Delta f$, can then be determined, by:

$$\Delta f = OC \cdot \alpha \qquad (1)$$

In a preferred variation of the present invention, the detecting of the intensity of the diffracted beams is carried out with a broad area photodetector which detects multiple plus and minus diffraction orders while excluding the zero order. This type of detector is illustrated in FIG. 3.

Figure 4:
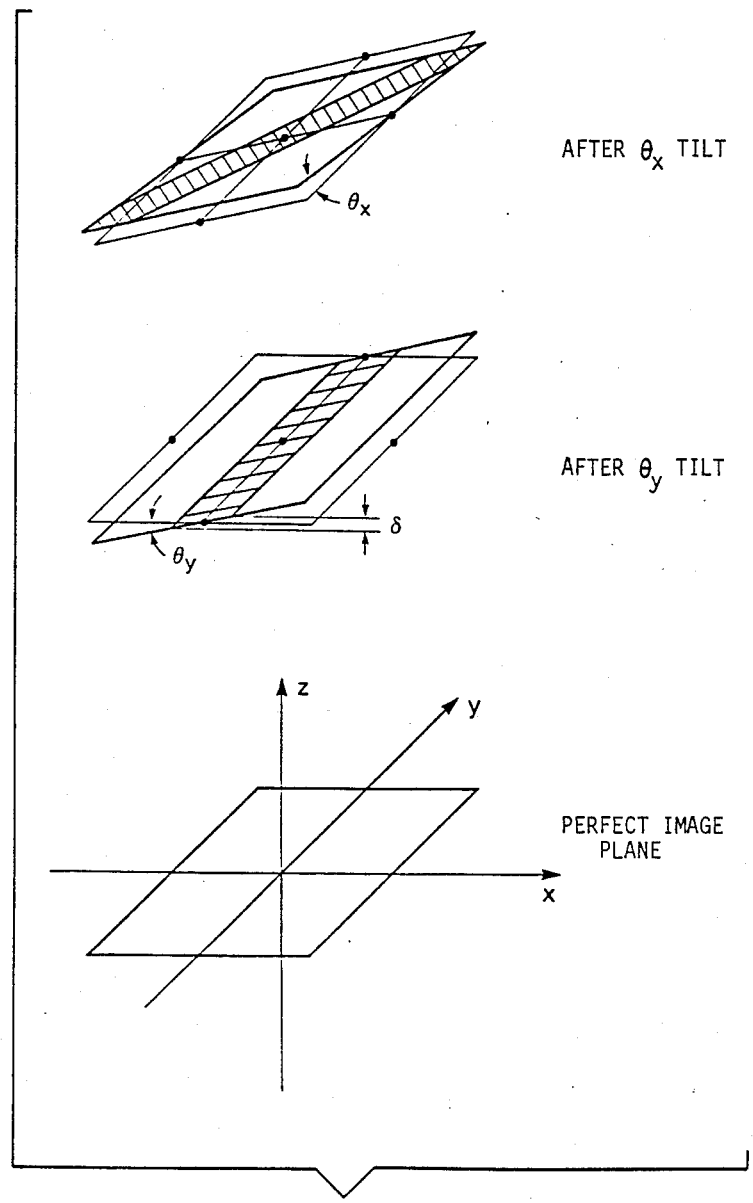
FIG. 4 illustrates compound tilts about the x and y axes.
Figure 5:
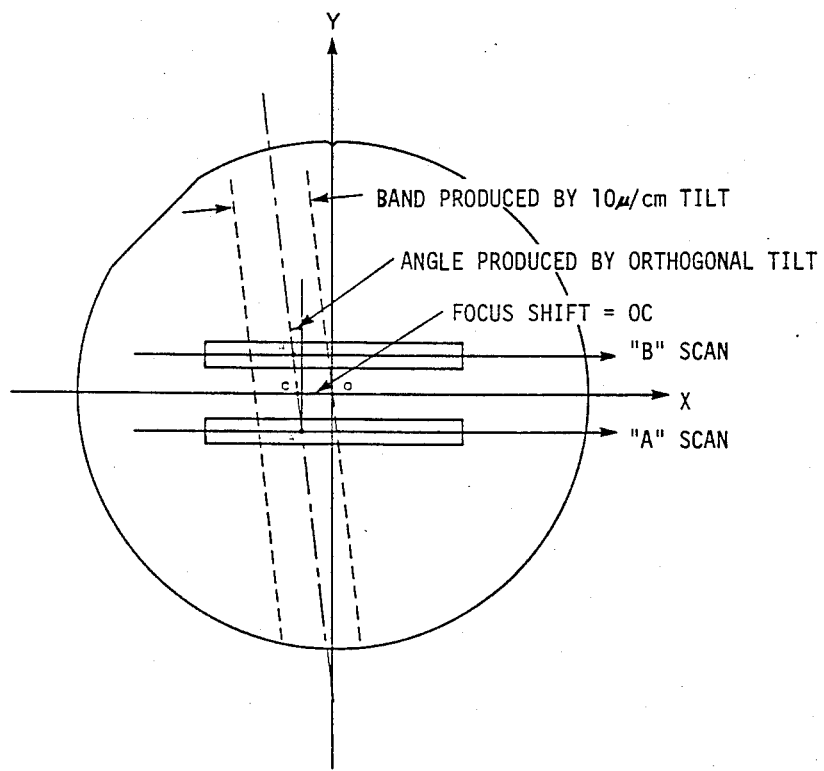
FIG. 5 shows two scan measurement for shift and tilt determination.

FIG. 4 shows equal tilts about both the y and x axes. The shaded area represents the region on the surface that falls within the depth of focus. The y tilt has been intentionally introduced in order to make the measurement. When there is an additional tilt about the x axis, then the band of good focus no longer runs parallel to the y axis, but will be inclined at some angle, as shown in FIG. 4. Once again, by knowing the bias tilt value and measuring the band location, the amount of the x tilt can be determined. In order to make this measurement, two scans, displaced from each other by a predetermined distance, $\Delta y$, are necessary as shown in FIG. 5. The two scans are made and the x coordinates of the centers of the band are located at points A and B. The position C on the x-axis is then calculated and the distance OC is used to determine the amount of focus shift using equation 1, while the angle that the line connecting points A & B makes with the y axis is related to the tilt, $\beta$, orthogonal to the bias tilt, by the following relationship:

$$\beta = (B-A)/\Delta y \cdot \alpha \qquad (2)$$

This procedure can be repeated with the creation of a second test structure with the mask rotated by 90 degrees and the bias tilt introduced along the x axis. A second set of values for tilt and defocus will be obtained. We then have four values which can be used to provide the correct focusing and tilt correction for the lithography tool. Note that we have obtained two focus correction values. These correspond to the optimum focus location for horizontal and vertical lines. If the lithography tool has no astigmatism, these two locations should be equal. If not, then the difference between them is the astigmatism. This information can be used in an iterative manner to make optical alignment adjustments if desired.

One additional concern in using this technique arises when the existing tilt in a tool is compound (i.e., it has both an x and a y tilt before the bias tilt is introduced). In this case, one must correct the bias tilt before calculating the defocus or orthogonal tilt. This is done by first performing all four scans. One then calculates intermediate tilt values based on the bias tilts used during exposure. When these intermediate tilt values are non-zero, one then calculates the actual tilt values using an iterative algorithm.

Returning again to FIG. 3, a schematic of an apparatus useful in the present invention is provided. The helium-neon laser used for illumination is unfocused. Two silicon detectors United Detector Technology Company are used. The scanning is done by McBain Company precision stages driven by Compumotor Company Drivers. There is a shaft encoder attached to the x stage to generate position signals for data collection. The entire system is controlled and the data collected and processed using a computer, for example, an IBM PC.

In carrying out the actual process of the present invention, an exposed silicon wafer with a photoresist surface relief structure is mounted on a vacuum chuck. There are two retractable pins built into the chuck for wafer registration. These pins locate the wafer in either of two orthogonal orientations to an accuracy of 0.05 mm. Thus, the wafer center is accurately positioned with respect to the reading beam and the wafer can be scanned in either the x or y direction. Since two scans are needed, a beam splitter and two detectors are used to provide these two scans in one physical translation of the stage. For reading the banding mask of FIG. 1 these beams are separated by 18 mm. The tool also has a perpendicular stage travel which is used to position the scans in the y direction, and may also be used for performing multiple scans at different y locations.

The entire tool is typically built on a 2×2 foot optical breadboard. The associated power supplies and driving electronics may be housed in a 19×24×24 inch chassis rack.

Figure 6:
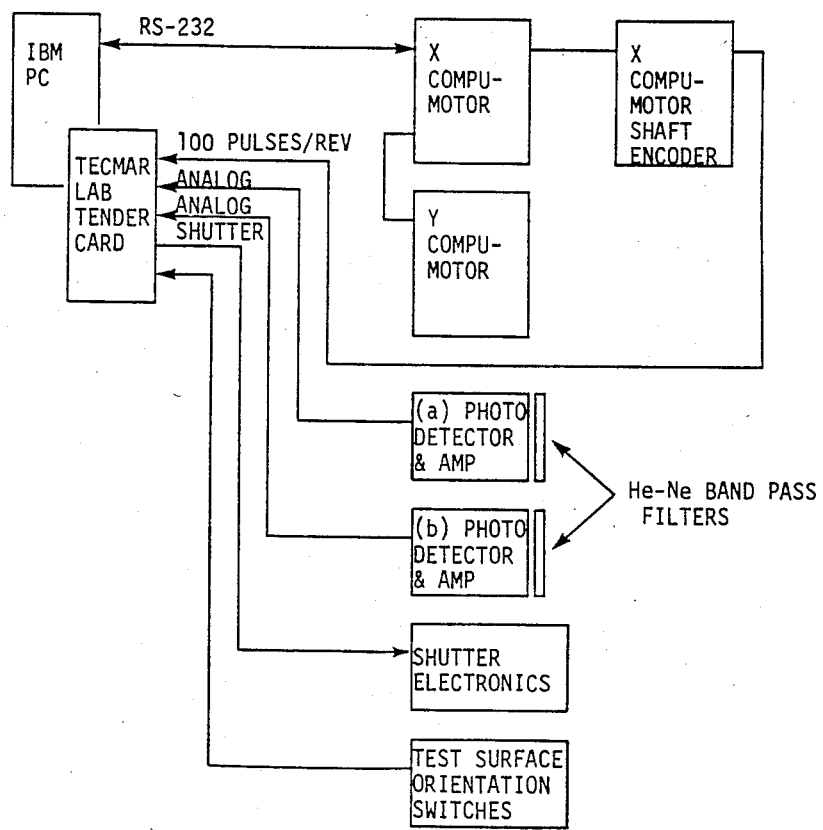
FIG. 6 is a schematic of an electronic control system suitable for use in the present invention.

The electronic control system is shown schematically in FIG. 6. The X and Y compumotor stages are linked to an IBM PC through an RS-232 interface. The shaft encoder generates 100 trigger pulses/rev. as the stage is travelling. These pulses are used by a Tecmar Company Lab Tender Card to initiate A/D conversion of the photodetector data. After each encoder pulse is received, the data is converted and stored in separate arrays. The Tecmar card is also used to control the shutter electronics and wafer orientation switches.

A suitable program may be written in Compiled Basic with some calls to machine code where speed is required. After the laser shutter is opened, the X stepping motor is started. In the interest of speed, the data is collected "on the fly" each time a pulse is received from the shaft encoder. At the end of the scan the laser shutter is closed; the motor is reversed and the stage is returned to a home position. The data is then plotted; a peak detection algorithm is employed and the necessary calculations are performed to determine focus shift and the two orthogonal tilts. The results of the calculations are displayed on the PC display monitor and may optionally be printed on the on-line printer for hardcopy.

The stage travels a distance of 4.0 inches and 4000 data points are taken at intervals of 0.001 inch. The lead screw has a pitch of 10/inch and the Compumotor driver produces 25,400 steps/rev. The data is gathered at a rate of 700 data points/sec with a maximum velocity of the stage of 7 rev/sec. The time required to scan and calculate for two wafers is less than one minute.

When diffraction intensity is plotted versus position on the scanned wafer, the intensity goes from a minimum value through a broad maximum before returning to the background minimum. This corresponds to going from an out-of-focus condition, through the best focus, and then returning to the out-of-focus condition on the other side of the wafer. These conditions are produced by the bias tilt used during wafer exposure. In practice, the intensity of the diffracted light in the broad central region is lower than the intensity of the diffracted light near the edges of the surface relief pattern. These maxima enable us to detect the locations of the two outside peaks and more accurately determine the center position of the scan.

It is obvious to those skilled in the art that the process of the present invention may be varied by using therein a plurality of illuminating beams and corresponding detectors.

We claim:

1. An optical system apparatus for focus correction for a lithographic tool, said apparatus comprising:
   (1) means for illuminating a periodic surface relief structure containing focus information which is on an object created in said lithographic tool, so that diffraction beams are generated,
   (2) means for translating the object orthogonally to the periodic structure, to cause a change in the intensity of the diffracted beams,
   (3) means for detecting the intensity of said diffracted beams, and
   (4) means for determining the focus correction based upon the changes in the intensity of the diffracted beams.

2. An apparatus as claimed in claim 1 wherein said means for illuminating is a laser.

3. An apparatus as claimed in claim 1 wherein the periodic surface relief structure is a photoresist.

4. An apparatus as claimed in claim 1 wherein said means for detecting is a broad area photodetector detecting multiple plus and minus diffraction orders and excluding the zero order.

5. An apparatus as claimed in claim 1 wherein a plurality of illumination beams and corresponding detectors are used.

6. An optical process for focus correction for a lithographic tool, said process comprising the steps:
   (1) illuminating a periodic surface relief structure containing focus information which is on an object created in said lithographic tool, so that diffraction beams are generated, (2) translating the object orthogonally to the periodic structure, to cause a change in the intensity of the diffracted beams, (3) detecting the intensity of the said diffracted beams, and (4) determining the focus correction based upon the changes in the intensity of the diffracted beams.

* * * * *